United States Patent
Higuchi et al.

(10) Patent No.: US 7,477,299 B2
(45) Date of Patent: Jan. 13, 2009

(54) IMAGING DEVICE

(75) Inventors: Tsuyoshi Higuchi, Kawasaki (JP); Jun Funakoshi, Kawasaki (JP); Seiji Yamagata, Kawasaki (JP); Toshitaka Mizuguchi, Kawasaki (JP); Katsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 651 days.

(21) Appl. No.: 11/133,386

(22) Filed: May 20, 2005

(65) Prior Publication Data

US 2006/0170794 A1     Aug. 3, 2006

(30) Foreign Application Priority Data

Feb. 3, 2005     (JP)     ............................. 2005-027771

(51) Int. Cl.
H04N 5/217     (2006.01)
H04N 3/14     (2006.01)

(52) U.S. Cl. ..................................... 348/241; 348/308

(58) Field of Classification Search ................ 348/308, 348/241, 193, 687, 673, 533, 248; 250/208.1
See application file for complete search history.

(56) References Cited

U.S. PATENT DOCUMENTS

| | | | | |
|---|---|---|---|---|
| 6,166,767 A * | 12/2000 | Watanabe | .................... | 348/301 |
| 6,201,572 B1 * | 3/2001 | Chou | ......................... | 348/241 |
| 6,798,452 B1 * | 9/2004 | Kuroda et al. | ............... | 348/301 |
| 6,963,367 B1 * | 11/2005 | Hashimoto | ................ | 348/241 |
| 7,098,950 B2 * | 8/2006 | Yamamoto et al. | ........... | 348/243 |
| 7,375,753 B2 * | 5/2008 | Mabuchi | ..................... | 348/308 |
| 7,382,409 B2 * | 6/2008 | Hiyama et al. | ............... | 348/308 |
| 7,408,577 B2 * | 8/2008 | Nakamura et al. | ........... | 348/308 |
| 2001/0013901 A1 * | 8/2001 | Matsunaga et al. | .......... | 348/308 |
| 2001/0052941 A1 * | 12/2001 | Matsunaga et al. | .......... | 348/308 |
| 2002/0012057 A1 * | 1/2002 | Kimura | ....................... | 348/308 |
| 2002/0149688 A9 * | 10/2002 | Matsunaga et al. | .......... | 348/308 |
| 2003/0025817 A1 * | 2/2003 | Yonemoto et al. | ............ | 348/308 |
| 2004/0046879 A1 * | 3/2004 | Ohzu et al. | .................. | 348/243 |
| 2005/0068432 A1 * | 3/2005 | Kozuka | ....................... | 348/241 |
| 2005/0195306 A1 * | 9/2005 | Koyama | ...................... | 348/308 |
| 2005/0206764 A1 * | 9/2005 | Kobayashi et al. | ........... | 348/308 |
| 2008/0057615 A1 * | 3/2008 | Okagawa et al. | .............. | 438/73 |

FOREIGN PATENT DOCUMENTS

| JP | 09-065215 | 3/1997 |
|---|---|---|
| JP | 2004-112740 | 4/2004 |

* cited by examiner

*Primary Examiner*—Lin Ye
*Assistant Examiner*—Marly Camargo
(74) *Attorney, Agent, or Firm*—Arent Fox LLP.

(57) ABSTRACT

A second source follower circuit of a reference voltage generator includes a transistor having the same characteristics as a first source follower circuit of a pixel. Accordingly, the second source follower circuit can generate a second reference voltage according to the change in characteristics of the first source follower circuit. A noise voltage switching circuit outputs a first voltage as a noise voltage to a pixel signal generator when the noise voltage is equal to or lower than the second reference voltage. In a reset state, the noise voltage and the second reference voltage always have a predetermined voltage difference. Therefore, deterioration in image quality can be prevented even when capturing a subject having high brightness. Since a trimming circuit or the like selecting any one of a plurality of reference voltages according to characteristics of a formed transistor becomes unnecessary, the cost of an imaging device can be reduced.

15 Claims, 9 Drawing Sheets

IMAGING DEVICE

CROSS-REFERENCE TO RELATED APPLICATIONS

This application is based upon and claims the benefit of priority from Japanese Patent Application No. 2005-027771, filed on Feb. 3, 2005, the entire contents of which are incorporated herein by reference.

BACKGROUND OF THE INVENTION

1. Field of the Invention

The present invention relates to an imaging device including a photoelectric conversion element. More particularly, this invention relates to the technology of improving the quality of a captured image when capturing a subject having high brightness.

2. Description of the Related Art

An imaging device such as a CMOS image sensor reads noise data (noise voltage) at respective photoelectric conversion elements during a reset period. For example, a correlated double sampling circuit (hereinafter also referred to as a CDS circuit) of the imaging device subtracts the noise data from pixel data which includes the read noise data, to thereby generate true pixel data. However, when a subject having high brightness is captured, the level of the noise data comes closer to the level of the pixel data due to the leakage of electric charges inside the imaging device. Since the level difference between the noise data and the pixel data becomes smaller, the brightness shown by the pixel data relatively lowers. In the case of capturing the sun, for example, the brightness of the sun becomes extremely low in the captured image, and the image of the sun becomes black. This phenomenon is generally referred to as black sun.

In Japanese Unexamined Patent Application Publication No. 2004-112740, the technique that a noise data level to be supplied to a CDS circuit is switched to a fixed voltage level when the level of the noise data becomes equal to or lower than a reference voltage level in order to prevent the black sun is disclosed. The fixed voltage level shows a standard black level when the brightness of the subject is zero, for example.

In the CMOS image sensor, the photoelectric conversion element is constituted of a photodiode and transistors. Threshold voltages of the transistors vary according to fabricating conditions of the imaging device (semiconductor). The above-described level of the noise data changes following the variation of the threshold voltages of the transistors. Meanwhile, in general, the above-described reference voltage is not influenced by the variation of the threshold voltages. Accordingly, the level of the noise data changes relatively to the above-described level of the reference voltage due to the variation of the threshold voltages. As a result of this, the problem arises that the noise data level and the fixed voltage level are not switched normally.

For example, when the noise data level becomes too high as compared to the reference voltage level, the noise data level cannot be switched to the fixed voltage level even though the phenomenon of the black sun is occurring. On the contrary, when the noise data level becomes low as compared to the reference voltage level, the noise data level is switched to the fixed voltage level at all times because it is determined that the phenomenon of the black sun is occurring at all times.

This kind of problem can be solved by generating a plurality of reference voltages by dividing resistance and the like, and switching between the reference voltages according to the threshold voltage of the manufactured transistor, for example. When the reference voltages are switched using this method, however, it is necessary to form a trimming circuit such as a fuse circuit inside the imaging device. Additionally, fuse cut process needs to be provided in test process for testing the imaging device. As a result of this, the cost of the imaging device increases.

SUMMARY OF THE INVENTION

It is an object of the present invention to prevent the phenomenon of black sun for certain, without being influenced by the variation of characteristics of transistors, and without increasing the cost.

According to a mode of an imaging device of the present invention, each of a plurality of pixels includes a photoelectric conversion element and a first source follower circuit. The first source follower circuit generates a noise voltage (noise data) and a pixel voltage (pixel data) according to an electric charge generated by the photoelectric conversion element. A reference voltage generator includes a voltage generator generating a first reference voltage and a second source follower circuit generating a second reference voltage according to the first reference voltage. For example, the second source follower circuit includes a transistor having the same characteristics as a transistor including the first source follower circuit. As the more preferred example, the transistor of the second source follower circuit has the same threshold voltage as a threshold voltage of the transistor of the first source follower circuit. A noise voltage switching circuit outputs the noise voltage to a pixel signal generator when the noise voltage exceeds the second reference voltage. The noise voltage switching circuit outputs a first voltage as the noise voltage to the pixel signal generator when the noise voltage is equal to or lower than the second reference voltage. The pixel signal generator outputs a voltage difference between the noise voltage and the pixel voltage as a pixel signal.

Since the reference voltage generator is formed using the second source follower circuit, the second reference voltage outputted from the second source follower circuit can be changed following the change in the noise voltage (value in a reset state) in response to the threshold voltage, which is outputted from the first source follower circuit. The second reference voltage can be changed according to the change in the characteristics of the first source follower circuit. Accordingly, the noise voltage is set to the value having a predetermined voltage difference from the second reference voltage at all times, irrespective of the threshold voltage of the transistor constituting the first source follower circuit. Therefore, the noise voltage switching circuit can operate normally at all times, and the phenomenon of the black sun can be prevented without fail, for example. As a result of this, the image quality can be prevented from deteriorating when a subject having high brightness is captured. Further, a trimming circuit or the like for selecting any one of plural reference voltages according to the characteristics of the formed transistor becomes unnecessary, and hence it is possible to reduce the cost of the imaging device.

According to a preferred example of the mode of the imaging device of the present invention, the transistor of the second source follower circuit has a larger gate width and the same channel length as compared to the transistor of the first source follower circuit. By increasing the gate width, a current amount flowing in the second source follower circuit can be made larger. As a result of this, it is possible for the second source follower circuit to generate the stable second reference voltage with high accuracy.
}

According to a preferred example of the mode of the imaging device of the present invention, an operation control circuit turns off a selection transistor of the second source follower circuit, so that power consumption of the second source follower circuit can be reduced. As a result of this, it is possible to reduce a standby current of the imaging device.

According to a preferred example of the mode of the imaging device of the present invention, the voltage generator includes a plurality of resistors connected in series, and generates the first reference voltage from any one of connecting nodes of the resistors. Accordingly, the values of the first reference voltage can be switched in accordance with the specification of the imaging device. Therefore, it is possible to ship an imaging device as a plurality of imaging devices for different specifications. As a result of this, developing cost of the imaging device can be reduced.

According to a preferred example of the mode of the imaging device of the present invention, the voltage generator includes a constant voltage generator generating the first reference voltage that is a constant voltage, using a power supply voltage. The first reference voltage does not vary by the power supply voltage, temperature, and the like. Since the first reference voltage is constant, the second reference voltage changes only by the influence of the characteristics of the second source follower circuit. Therefore, the second reference voltage can be changed following the change in the noise voltage (value in the reset state) outputted from the first follower circuit without fail.

According to a preferred example of the mode of the imaging device of the present invention, the value of the first reference voltage can be set to various values corresponding to the specification of the imaging device. Further, a prototype of the imaging device can be evaluated using the various first reference voltages.

According to a preferred example of the mode of the imaging device of the present invention, a plurality of the second source follower circuits connected in parallel in the reference voltage generator receive the first reference voltage in common and generate the second reference voltage in common. Accordingly, the characteristics of the plural second source follower circuits can be averaged. The reference voltage generator can generate the average second reference voltage independent of individual circuit characteristics. Further, since the total amount of the current flowing in the second source follower circuit can be increased, it is possible for the reference voltage generator to generate the stable second reference voltage with high accuracy.

According to a preferred example of the mode of the imaging device of the present invention, the second source follower circuits are formed by using the first source follower circuits of a part of the pixels in a pixel array. Therefore, the characteristics of the second source follower circuit can be easily brought into agreement with those of the first source follower circuit. As a result of this, the second reference voltage outputted from the second source follower circuit can be changed properly following the change in the noise voltage (value in the reset state) outputted from the first follower circuit.

According to a preferred example of the mode of the imaging device of the present invention, the second source follower circuits are formed by using the first source follower circuit of the pixel at one end of the pixel array and the first source follower circuit of the pixel at the other end thereof. Since the second source follower circuits are formed at the positions separated from each other, the average second reference voltage can be generated without fail.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
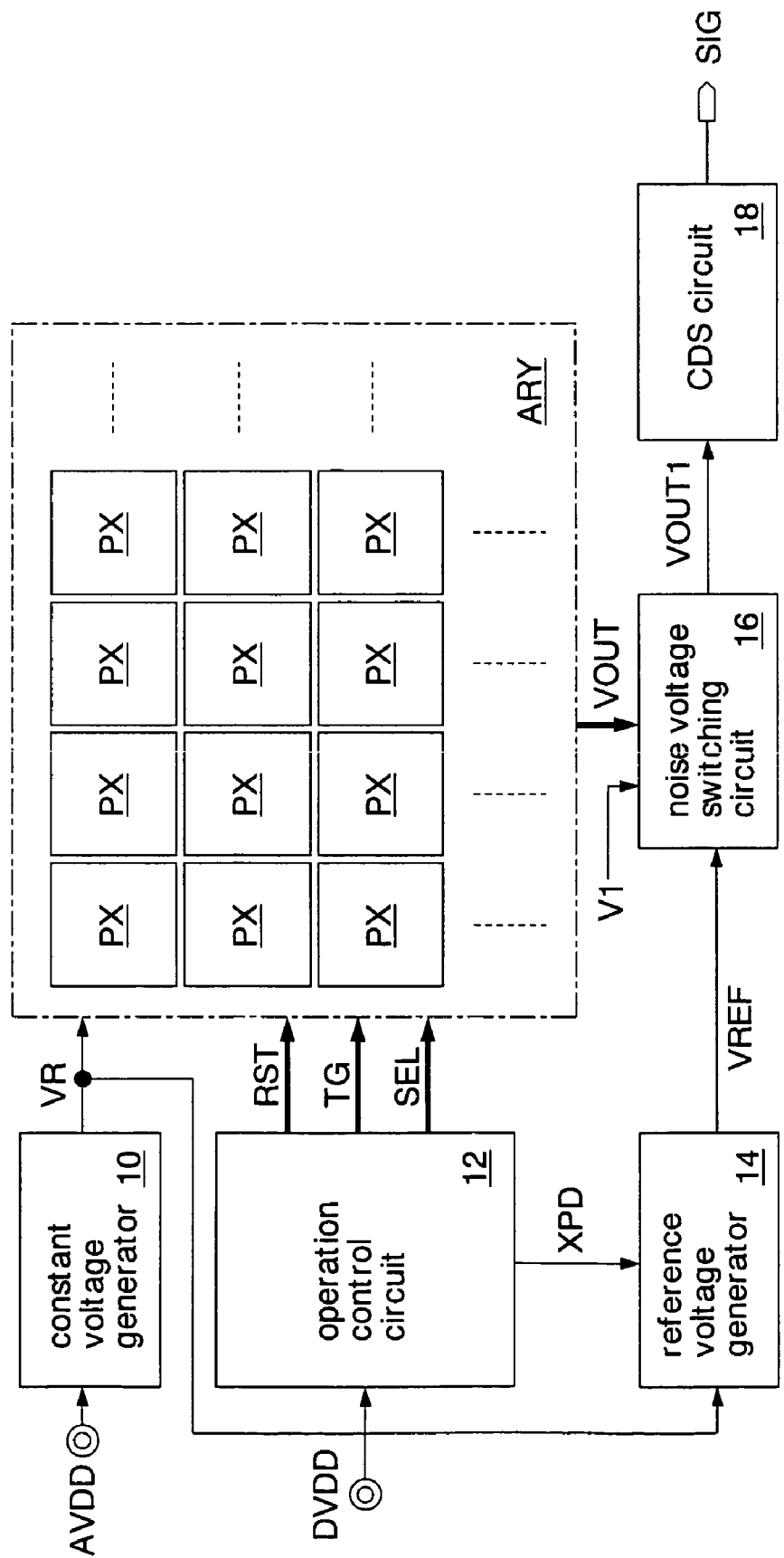
FIG. 1 is a block diagram showing a first embodiment of an imaging device according to the present invention.

Hereinafter, preferred embodiments of the present invention will be explained with reference to the drawings. Double circles in the drawings represent external terminals. In the drawings, each bold line represents a signal line consisting of a plurality of lines. Some of blocks connected with the bold line consist of a plurality of circuits, respectively. Signal lines for transmitting signals are designated by the same reference symbols as the names of the signals.

FIG. 1 shows a first embodiment of an imaging device according to the present invention. This imaging device is formed as a CMOS image sensor chip on a silicon substrate using CMOS technology. The imaging device includes a constant voltage generator 10, an operation control circuit 12, a reference voltage generator 14, a noise voltage switching circuit 16, a correlated double sampling circuit (CDS circuit) 18, and a pixel array ARY.

The constant voltage generator 10 generates an internal voltage VR which is constant at all times, according to a power supply voltage AVDD. The power supply voltage AVDD is the power supply voltage for analog circuits. A power supply voltage DVDD for digital circuits may be supplied to the constant voltage generator 10. The internal voltage VR is the voltage lower than the power supply voltage AVDD, and is kept constant at all times irrespective of the change in the power supply voltage AVDD and the change in temperature. The operation control circuit 12 controls the operation of the imaging device as a whole. The operation control circuit 12 outputs a reset signal RST, a transfer control signal TG, and a selection control signal SEL to the pixel array ARY, and outputs a standby signal XPD to the reference voltage generator 14. The standby signal XPD changes to a high level during an operation period (light-receiving operation) when pixels PX detect light, and changes to a low level during a standby period when the pixels PX do not detect light.

The reference voltage generator 14 generates a reference voltage (second reference voltage) VREF, according to the internal voltage VR. The reference voltage generator 14 generates the reference voltage VREF while it receives the high-level standby signal XPD, and stops generating the reference voltage VREF while it receives the low-level standby signal XPD.

When a voltage level VOUT (noise voltage, noise data) of a read signal exceeds the reference voltage VREF during a reset period of read operation which will be described later, the noise voltage switching circuit 16 outputs this voltage level VOUT as a noise voltage VOUT1. When the voltage level VOUT of the read signal is equal to or lower than the reference voltage VREF during the reset period, the noise voltage switching circuit 16 outputs a fixed first voltage V1 as the noise voltage VOUT1. The first voltage V1 shows a standard level (black level) when brightness of a subject is zero, for example.

The CDS circuit 18 subtracts the noise data (noise voltage) read during the reset period from pixel data (pixel voltage) read during the read period, generates true pixel data without including the noise, and outputs the generated pixel data as a pixel signal SIG. The pixel array ARY includes a plurality of the pixels PX arranged in a matrix state. The pixel data and the noise data obtained by photoelectric conversion by the respective pixels PX are outputted as a detection voltage VOUT.

Figure 2:
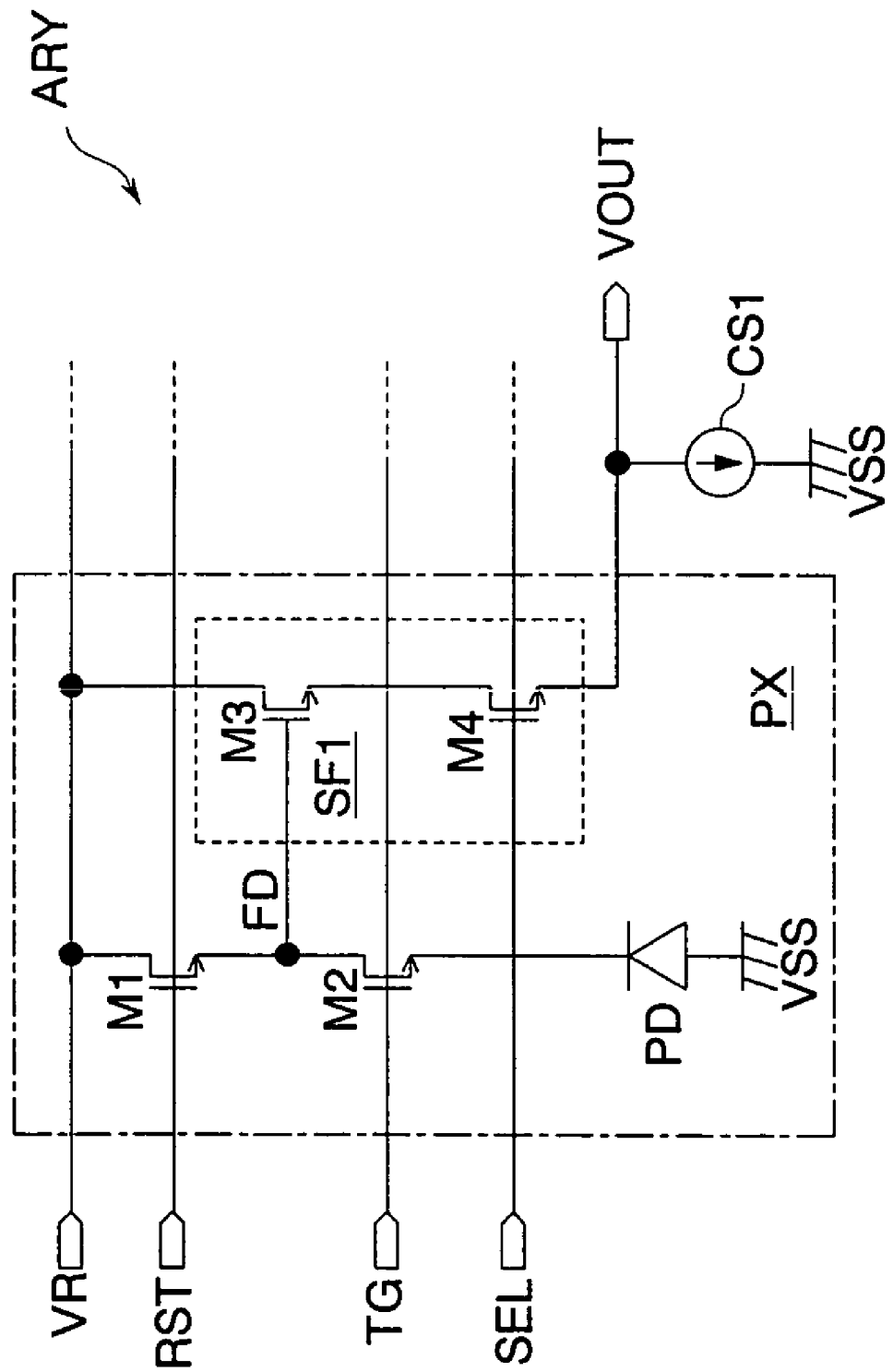
FIG. 2 is a circuit diagram showing the details of a pixel array shown in FIG. 1.

FIG. 2 shows the details of the pixel array ARY shown in FIG. 1. The pixel PX of this embodiment is the so-called 4-transistor type. Each pixel PX includes nMOS transistors M1, M2 and a photodiode PD (photoelectric conversion circuit) which are connected in series between an internal voltage line VR and a ground line VSS, and nMOS transistors M3, M4 and a current source CS1 which are connected in series between the internal voltage line VR and the ground line VSS. A source of the transistor M4 is connected to a detection voltage line VOUT through which the read voltage and the noise voltage are outputted. A gate of the transistor M1 (reset transistor) receives the reset signal RST. A gate of the transistor M2 (transfer transistor) receives the transfer control signal TG. A gate of the transistor M3 (source follower transistor) is connected to a connecting node FD (floating diffusion node) between the transistors M1 and M2. A gate of the transistor M4 (selection transistor) receives the selection control signal SEL. The transistor M3 is the source follower transistor. The transistors M3 and M4 constitute a source follower circuit SF1 (first source follower circuit).

Figure 3:
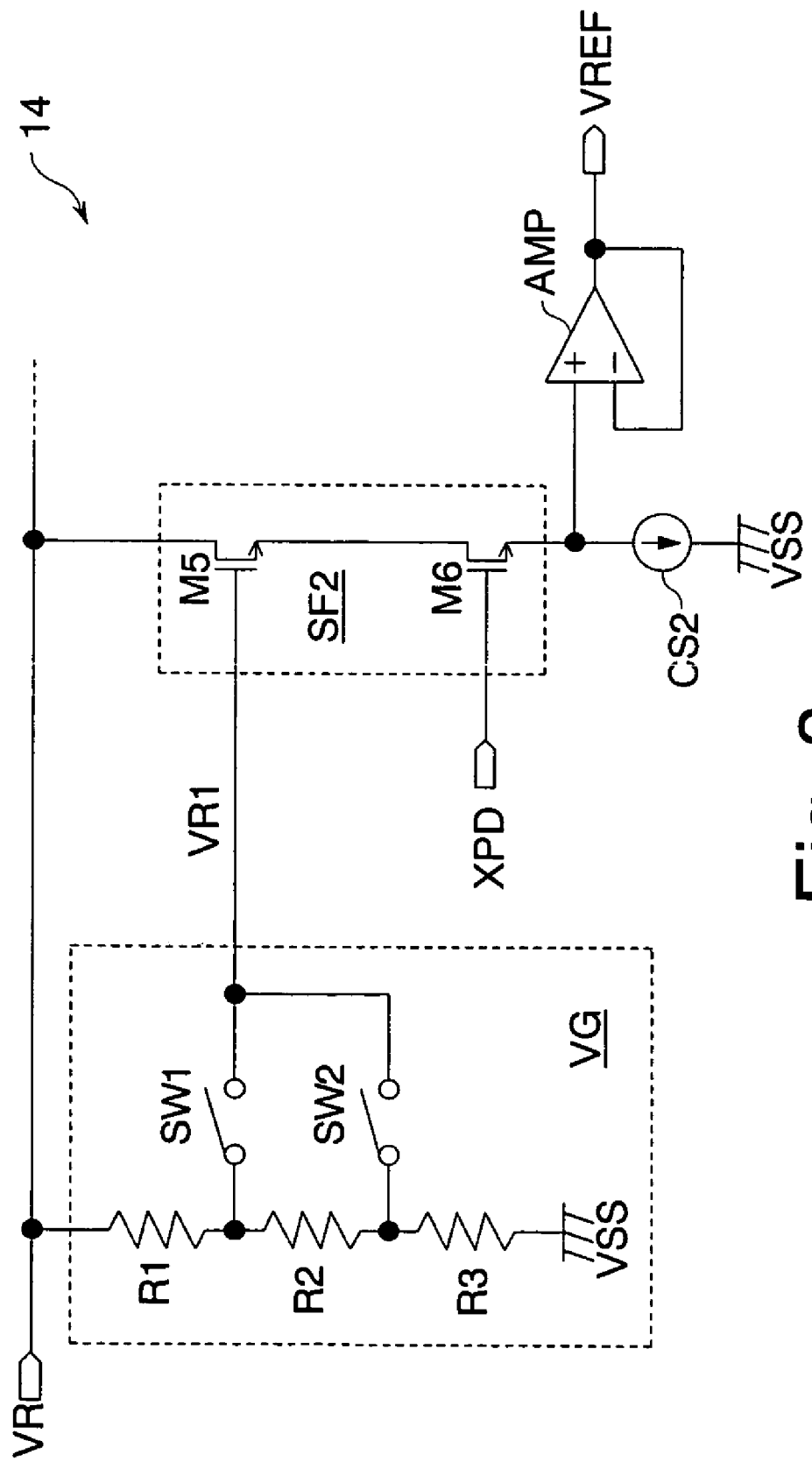
FIG. 3 is a circuit diagram showing the details of a reference voltage generator shown in FIG. 1.

FIG. 3 shows the details of the reference voltage generator 14 shown in FIG. 1. The reference voltage generator 14 includes a voltage generator VG, a source follower circuit SF2 (second source follower circuit) having the same electric characteristics as the source follower circuit SF1 of the pixel PX, a current source CS2, and an amplifier AMP. The voltage generator VG includes resistors R1, R2 and R3 which are connected in series between the internal voltage line VR and the ground line VSS, and switches SW1 and SW2 which connect connecting nodes between the resistors R1 to R3 to a gate of an nMOS transistor M5 of the source follower circuit SF2.

Either of the switches SW1 and SW2 turns on according to a value of a resister formed inside the image sensor. The value of the resister is set by a user (system) using the image sensor when turning the power on, for example. By switching between the switches SW1 and SW2, either of two voltages generated by a resistor row R1 to R3 is supplied as a first reference voltage VR1 to the gate of the transistor M5 of the source follower circuit SF2. Incidentally, the gate voltage of the transistor M5 is set slightly lower than the noise voltage when the pixels PX do not receive light. Since the gate voltage of the transistor M5 can be switched by the switches SW1 and SW2, it is possible to ship an image sensor chip as the image sensor for a plurality of specifications (characteristics), for example.

The source follower circuit SF2 includes nMOS transistors M5 and M6 whose threshold values are the same as the nMOS transistors M3 and M4 of the source follower circuit SF1, respectively. For example, gate widths of the transistors M5 and M6 are respectively designed to be twice as large as gate widths of the transistors M3 and M4. Channel lengths of the transistors M5 and M6 are the same as channel lengths of the transistors M3 and M4. By increasing the gate widths, a current amount flowing in the source follower circuit SF2 can be made larger as compared to the source follower circuit SF1. Accordingly, it is possible for the source follower circuit SF2 to operate stably and generate the stable second reference voltage with high accuracy. Incidentally, a current amount of the current source CS2 is also designed to be twice as large as a current amount of the current source CS1.

A gate of the transistor M6 receives the standby signal XPD. Since the transistor M6 is turned off during the standby period when the pixels PX do not detect light, it is possible to reduce a standby current. The current source CS2 is arranged between a source of the transistor M6 and the ground line VSS. The amplifier AMP amplifies a source voltage of the transistor M6 and outputs it as the reference voltage VREF.

The source follower circuit SF2 which is the same as that of the pixel PX is formed inside the reference voltage generator 14. Accordingly, when fabricating conditions of the image sensor vary in its fabrication process and the threshold voltages of the transistors (M3 and M4, for example) inside the pixel PX change, the reference voltage VREF also changes. More specifically, when the threshold voltages of the transistors M3 and M4 in the pixel PX are high, the noise voltage decreases relatively. Since the image sensor is formed by one chip, the threshold voltages of the transistors M5 and M6 increase along with the threshold voltages of the transistors M3 and M4. Therefore, the reference voltage VREF decreases following the noise voltage. On the contrary, when the threshold voltages of the transistors M3 and M4 are low, the noise voltage increases relatively. The threshold voltages of the transistors M5 and M6 decrease at this time, and hence the reference voltage VREF increases following the noise voltage. By thus changing the reference voltage VREF following the change in the noise voltage which depends on the threshold voltages of the transistors, the noise voltage switching circuit 16 shown in FIG. 4 operates stably.

Figure 4:
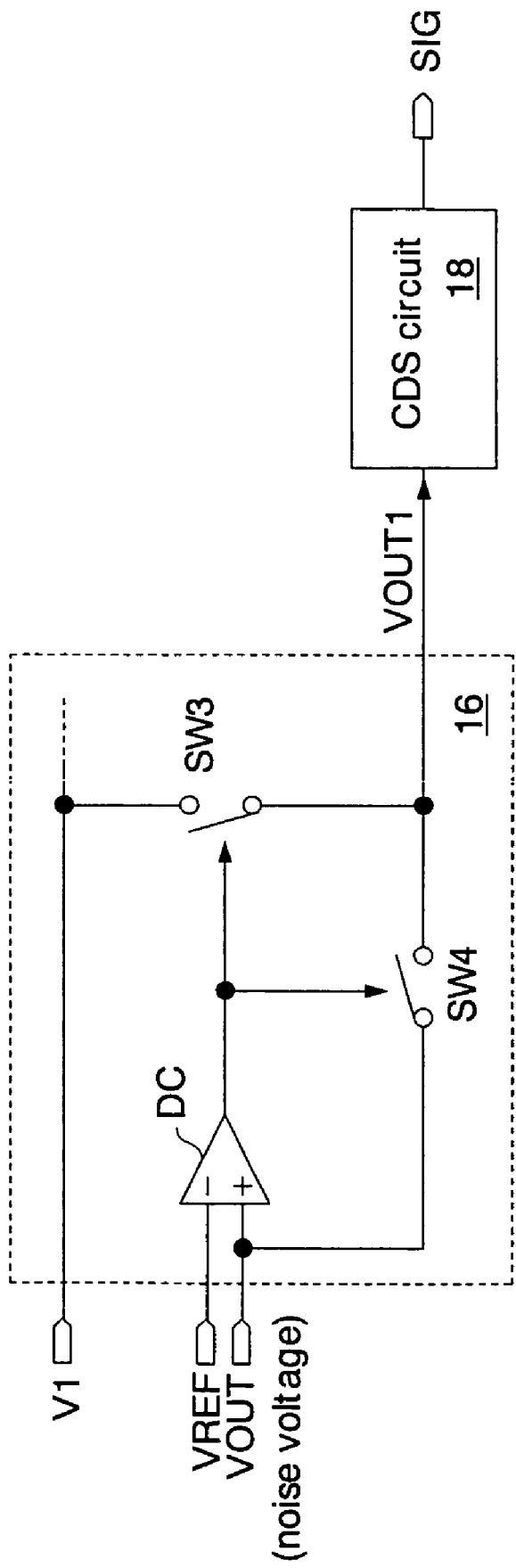
FIG. 4 is a circuit diagram showing the details of a noise voltage switching circuit shown in FIG. 1.

FIG. 4 shows the details of the noise voltage switching circuit 16 shown in FIG. 1. The noise voltage switching circuit 16 includes a decision circuit DC which compares the reference voltage VREF and the noise voltage VOUT outputted from the pixels PX, and switches SW3 and SW4 which turn on/off according to the decision result of the decision circuit DC. The decision circuit DC outputs a high level when the noise voltage VOUT is higher than the reference voltage VREF. In this case, the switch SW3 turns off and the switch SW4 turns on. The CDS circuit 18 generates the pixel signal SIG using the noise voltage VOUT read from the pixels PX. Meanwhile, the decision circuit DC outputs a low level when the noise voltage VOUT is equal to or lower than the reference voltage VREF. In this case, the switch SW3 turns on and the switch SW4 turns off. The CDS circuit 18 generates the pixel signal SIG using the fixed first voltage V1.

Figure 5:
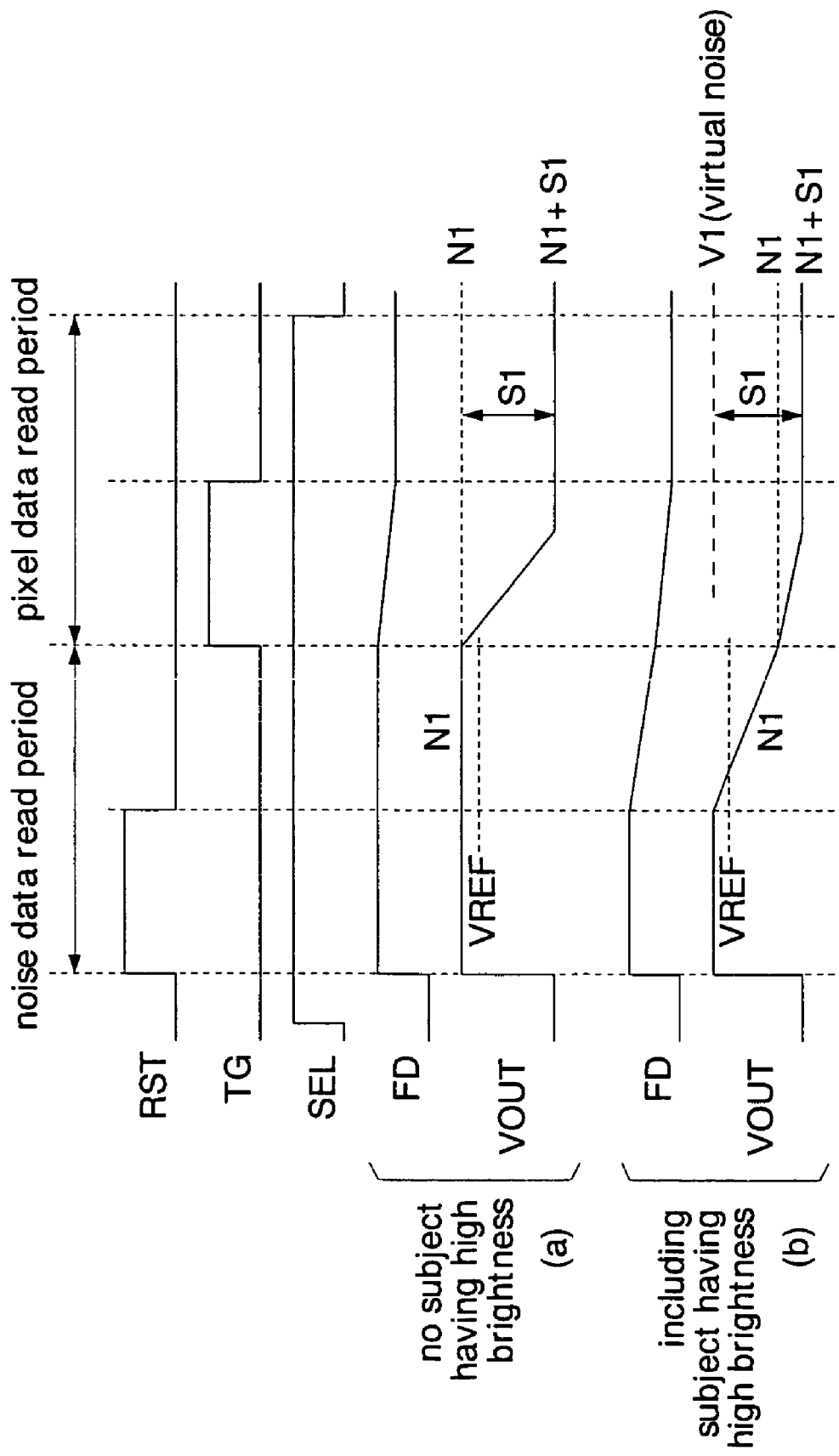
FIG. 5 is a timing chart showing read operation of a pixel signal in each of pixels of an image sensor.

FIG. 5 shows the read operation of the pixel signal in each of the pixels of the image sensor described above. The read operation is made of a noise data read period and a pixel data read period. Before the read operation is started, the selection control signal SEL is set at the high level (power supply voltage) in order to turn on the transistor M4. The reset signal RST and the transfer control signal TG are set at the low level (ground voltage) in order to turn off the transistors M1 and M2.

First, during the noise data read period, the reset signal RST is changed to the high level, and the transistor M1 is turned on. By turning on the transistor M1, the node FD is reset to the internal voltage VR. Next, the reset signal RST is changed to the low level, and noise data N1 is read. Since the source follower circuit SF1 is operated accompanying the change in the voltage of the node FD, the noise data (noise voltage) N 1 is outputted as the detection voltage VOUT.

Subsequently, during the pixel data read period, the transfer control signal TG is changed to the high level, and the transistor M2 is turned on. By turning on the transistor M2, electric charges accumulated in the photodiode by capturing the image of the subject are transferred to the node FD. The voltage of the node FD decreases according to the amount of the charges. Incidentally, the change in the voltage of the node FD is also influenced by the noise data N1. Next, the transfer control signal TG is changed to the low level, and the pixel data including the noise data N1 (N1+S1) is read. Since the source follower circuit SF1 is operated accompanying the change in the voltage of the node FD, the pixel data (pixel voltage) including the noise data N1 is outputted as the detection voltage VOUT.

The CDS circuit 18 shown in FIG. 1 subtracts the noise voltage N1 from the pixel voltage including the noise data N1 (N1+S1), and outputs the true pixel data excluding the noise data as the pixel signal SIG. Incidentally, when the subject to be captured by the image sensor does not have high brightness (FIG. 5(a)), the noise voltage N1 is higher than the reference voltage VREF. Therefore, the correct noise data N1 is read during the noise data read period. The noise voltage switching circuit 16 shown in FIG. 4 turns off the switch SW3 and turns on the switch SW4, to output the noise voltage N1 to the CDS circuit 18.

Meanwhile, when the subject to be captured by the image sensor has high brightness (FIG. 5(b)), the noise voltage N1 becomes lower than the reference voltage VREF due to the leakage of the electric charges caused in a substrate and so on of the image sensor. At this time, the noise voltage switching circuit 16 turns on the switch SW3 and turns off the switch SW4, to output the fixed first voltage V1 showing the virtual noise to the CDS circuit 18.

According to this invention, the reference voltage generator 14 includes the source follower circuit SF2 having the same electric characteristics as the source follower circuit SF1 formed in the pixel PX. Accordingly, when the fabricating conditions in semiconductor fabrication process vary and the threshold voltages of the transistors constituting the image sensor change, the reference voltage VREF also changes following the change in the noise voltage N1. Therefore, in a reset state of the pixel PX (period when the reset signal RST is at the high level), the noise voltage N1 is higher than the reference voltage VREF by a predetermined value at all times, irrespective of the threshold voltages of the transistors. The noise voltage N1 in the reset state varies depending on the threshold voltages of the transistors. Therefore, in the conventional art, the above-mentioned predetermined value has varied between plural image sensors formed on a wafer, wafers, and lots. By applying the present invention, it is possible to allow a difference between the noise voltage V1 and the reference voltage VREF in the reset state to be constant at all times between the plural image sensors on the wafer, the wafers, and the lots. As a result of this, it is possible to prevent the noise voltage N1 from being too high as compared to the reference voltage VREF, and to solve the problem that the noise voltage N1 cannot be switched to the first voltage V1 although the phenomenon of black sun is occurring. Further, it is possible to prevent the noise voltage N1 from being too low as compared to the reference voltage VREF, and to solve the problem that the noise voltage N1 is switched to the first voltage V1 at all times because it is determined that the phenomenon of the black sun is occurring at all times.

According to the first embodiment described thus far, the reference voltage generator 14 includes the source follower circuit SF2 whose threshold voltages are the same as those of the source follower circuit SF1 in the pixel PX. Therefore, even when the threshold voltages of the transistors constituting the image sensor change due to the variation of the fabricating conditions, it is possible to change the reference voltage VREF following the change in the noise voltage N1 in the reset state. Since a desired reference voltage VREF can be generated according to the electric characteristics of the source follower circuit SF1 inside the pixel PX, the noise voltage switching circuit 16 can be operated normally at all times. As a result of this, it is possible to prevent the phenomenon of the black sun without fail, and to prevent the image quality from deteriorating when the subject having high brightness is captured.

A trimming circuit (fuse circuit) or the like for selecting any one of the plural reference voltages according to the electric characteristics of the formed transistor becomes unnecessary. In general, a passivation layer of the chip in the periphery of the fuse circuit needs to be eliminated in order to perform laser cutting in test process, and the process of selectively eliminating the passivation layer is necessary in the fabrication process. In the test process, the electric characteristics of the image sensor are evaluated, and the fuse is cut according to the evaluation result. By applying the present invention, it is possible to prevent the fabrication process of the image sensor from increasing and to eliminate the test process for the trimming. It is also possible to eliminate the equipment such as a testing apparatus. Further, since the fuse circuit becomes unnecessary, chip size can be reduced. As a result of this, it is possible to reduce fabrication cost of the image sensor.

By making the gate widths of the transistors of the source follower circuit SF2 larger than the gate widths of the transistors of the source follower circuit SF1, the current amount flowing in the source follower circuit SF2 can be increased. As a result of this, it is possible for the source follower circuit SF2 to generate the stable reference voltage VREF with high accuracy.

The voltage generator VG of the reference voltage generator 14 selects any one of the plural voltages by the switches SW1 and SW2, and outputs is as the first reference voltage VR1 (gate voltage of the transistor M5). Therefore, it is possible to ship an image sensor chip as the image sensor for a plurality of specifications (characteristics), and to reduce developing cost of the image sensor.

Figure 6:
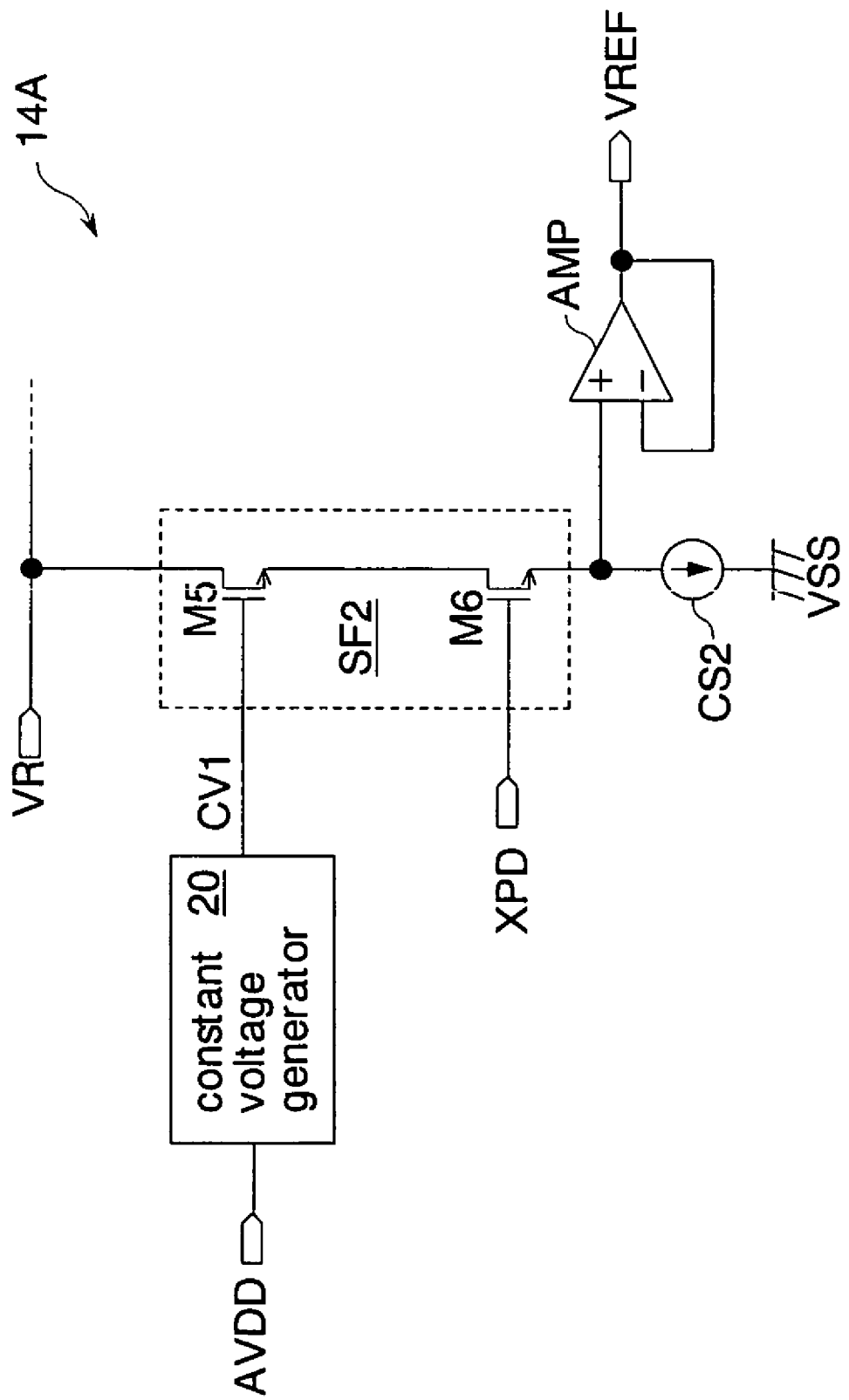
FIG. 6 is a circuit diagram showing a reference voltage generator according to a second embodiment of the imaging device of the present invention.

FIG. 6 shows a reference voltage generator 14A according to a second embodiment of the imaging device of the present invention. The same numerals and symbols are given to designate the same elements as those explained in the first embodiment, and detailed explanations thereof will be omitted. According to this embodiment, the reference voltage generator 14A is formed instead of the reference voltage generator 14 of the first embodiment. In other respects, its structure is the same as that of the first embodiment. That is, this imaging device is formed as a CMOS image sensor chip on a silicon substrate using CMOS technology.

The reference voltage generator 14A includes a constant voltage generator 20 instead of the voltage generator VG in the reference voltage generator 14 of the first embodiment. In other respects, its structure is the same as that of the reference voltage generator 14. The constant voltage generator 20 generates a constant voltage CV1 which is constant at all times, in response to a power supply voltage AVDD. The constant voltage CV1 is lower than an internal voltage VR, and is kept constant at all times irrespective of the change in the power supply voltage AVDD and the change in temperature. Incidentally, a power supply voltage DVDD for digital circuits may be supplied to the constant voltage generator 20. By forming the reference voltage generator 14A, a gate voltage to be supplied to a transistor M5 in a source follower circuit SF2 can be made constant at all times. Accordingly, a reference voltage VREF changes in response to only the variation of threshold voltages of transistors constituting the source follower circuit SF2.

According to the second embodiment described thus far, it is possible to obtain the same effects as those of the above-described first embodiment. Further, according to this embodiment, the reference voltage REF can be made constant irrespective of the change in the power supply voltage and change in the temperature, and can be changed following only the change in a noise voltage N1 in a reset state (that is, the difference of the threshold voltages of the transistors constituting the source follower circuit SF1) without fail.

Figure 7:
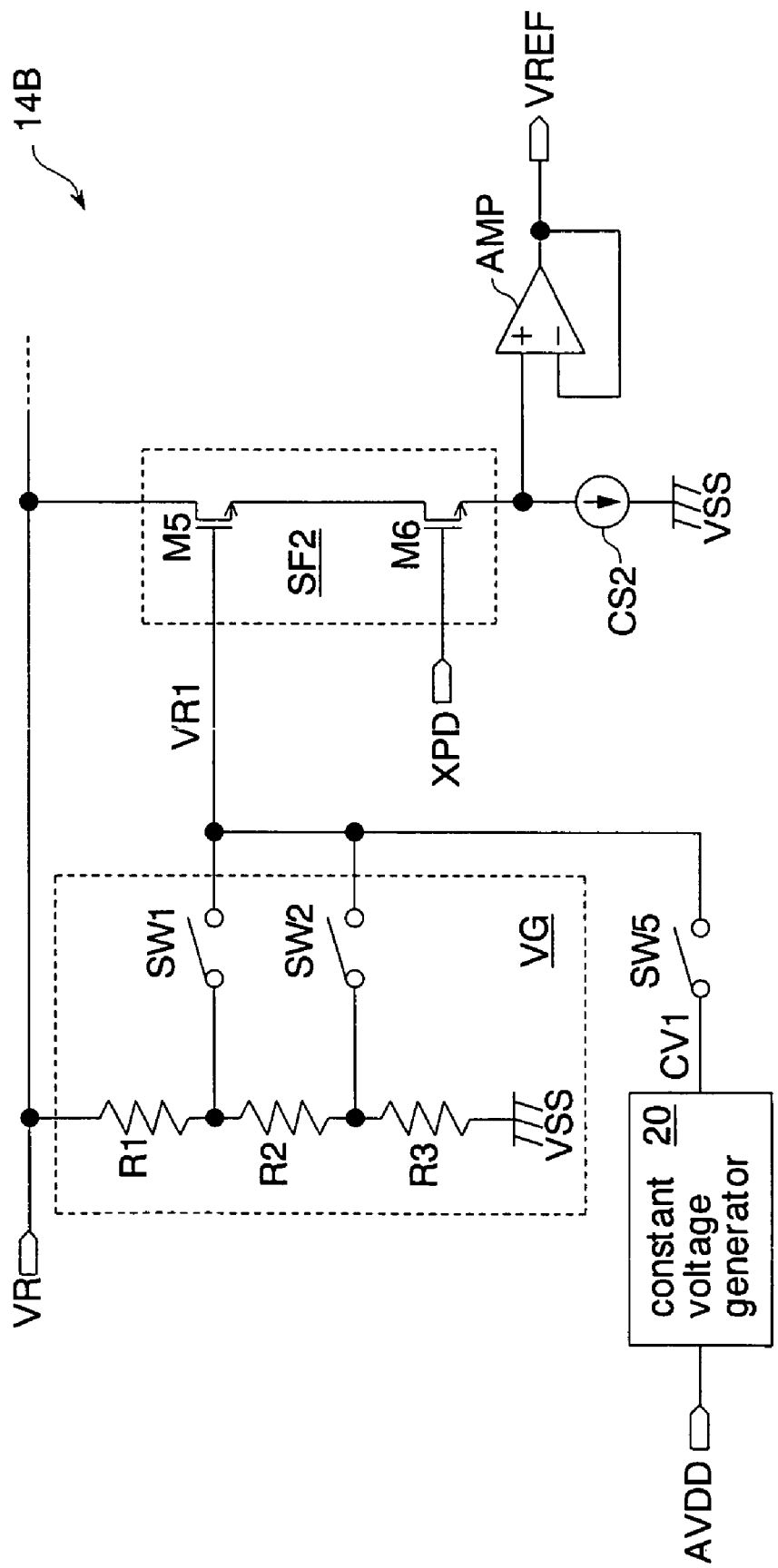
FIG. 7 is a circuit diagram showing a reference voltage generator according to a third embodiment of the imaging device of the present invention.

FIG. 7 shows a reference voltage generator 14B according to a third embodiment of the imaging device of the present invention. The same numerals and symbols are given to designate the same elements as those explained in the first and second embodiments, and detailed explanations thereof will be omitted. According to this embodiment, the reference voltage generator 14B is formed instead of the reference voltage generator 14 of the first embodiment. In other respects, its structure is the same as that of the first embodiment. That is, this imaging device is formed as a CMOS image sensor chip on a silicon substrate using CMOS technology.

The reference voltage generator 14B includes a constant voltage generator 20 together with the voltage generator VG in the reference voltage generator 14 of the first embodiment. In other respects, its structure is the same as that of the reference voltage generator 14. An output CV1 of the constant voltage generator 20 is connected to a gate of a transistor M5 in a source follower circuit SF2 via a switch SW5. Any one of switches SW1, SW2 and SW5 turns on according to a value of a resister formed inside the image sensor. The value of the resister is set by a user (system) using the image sensor when turning the power on, for example. Whichever switch is turned on among the switches SW1, SW2 and SW5, the gate voltage of the transistor M5 is set slightly lower than a noise voltage when pixels PX do not receive light.

According to the third embodiment described thus far, it is possible to obtain the same effects as those of the above-described first embodiment. Further, according to this embodiment, any one of three kinds of voltages can be selected by the switch SW1, SW2 or SW5, and outputted as a first reference voltage VR1 (gate voltage of the transistor M5). Therefore, it is possible to form the image sensor for many more specifications (characteristics) using an image sensor chip, and to reduce the developing cost of the image sensor.

Figure 8:
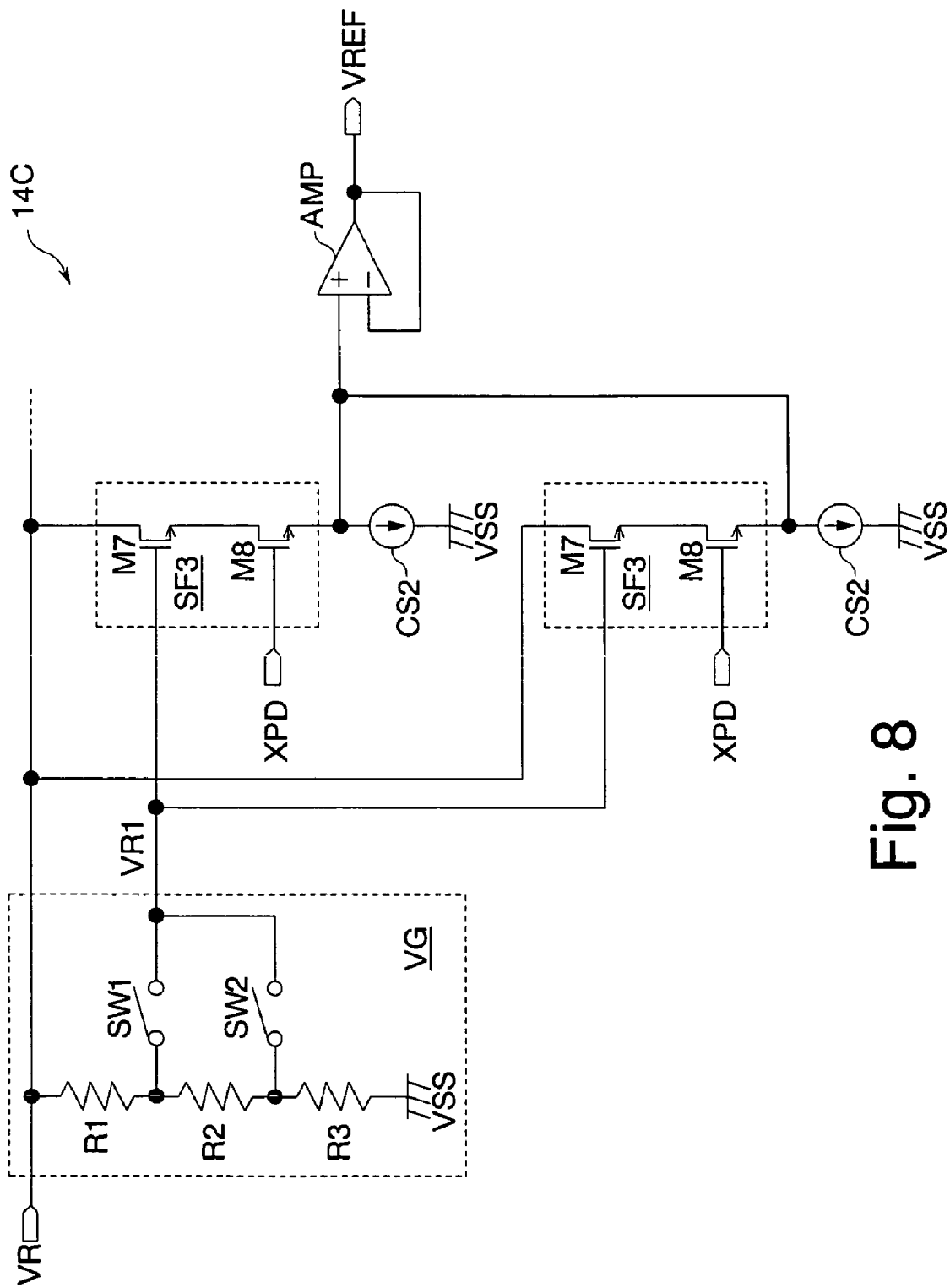
FIG. 8 is a circuit diagram showing a reference voltage generator according to a fourth embodiment of the imaging device of the present invention.

FIG. 8 shows a reference voltage generator 14C according to a fourth embodiment of the imaging device of the present invention. The same numerals and symbols are given to designate the same elements as those explained in the first embodiment, and detailed explanations thereof will be omitted. According to this embodiment, the reference voltage generator 14C is formed instead of the reference voltage generator 14 of the first embodiment. In other respects, its structure is the same as that of the first embodiment. That is, this imaging device is formed as a CMOS image sensor chip on a silicon substrate using CMOS technology.

The reference voltage generator 14C includes a pair of source follower circuits SF3 (second source follower circuits) arranged in parallel between a voltage generator VG and an amplifier AMP. Each of the source follower circuits SF3 includes nMOS transistors M7 and M8 whose threshold voltages are the same as the nMOS transistors M3 and M4 of the source follower circuit SF1, respectively. For example, gate widths of the transistors M7 and M8 are the same as gate widths of the transistors M3 and M4. Channel lengths of the transistors M7 and M8 are the same as channel lengths of the transistors M3 and M4. The plural source follower circuits SF3 in the reference voltage generator 14C have the same effect as the increase of the gate widths of the transistors in one source follower circuit (SF1 in the first embodiment, for example). That is, similarly to the first embodiment, it is possible to increase a current amount flowing in the source follower circuits SF3 and to operate the source follower circuits SF3 stably.

Figure 9:
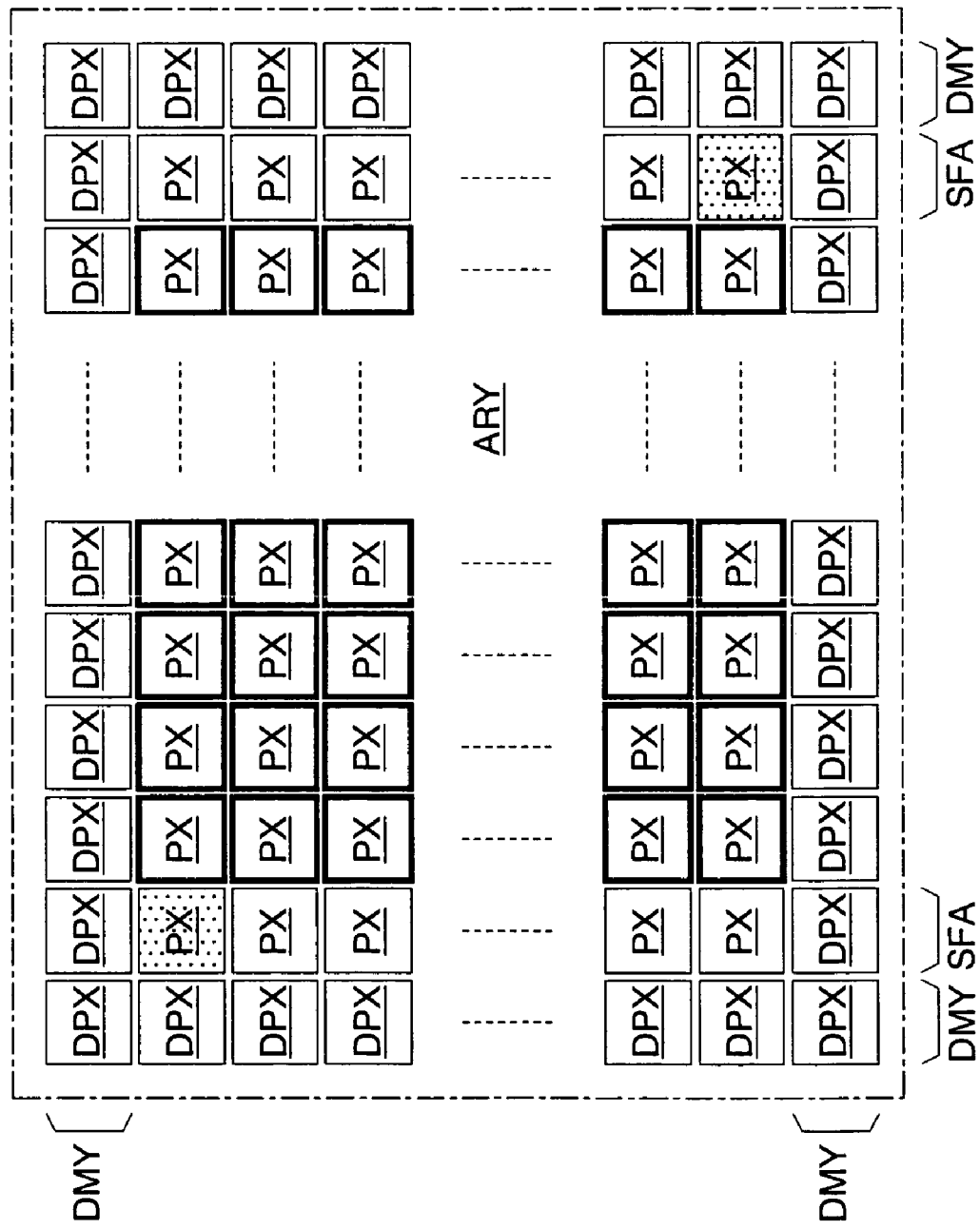
FIG. 9 is a block diagram showing the details of a pixel array according to the fourth embodiment.

FIG. 9 shows the details of a pixel array ARY according to the fourth embodiment. The pixel array ARY includes a plurality of pixels PX arranged in a matrix state. Dummy pixels DPX formed in a dummy region DMY positioned on an outermost side of the pixel array ARY are not used for photoelectric conversion. The dummy pixels DPX are formed to form the inner pixels PX to have the ideal shape. On both right and left sides of the drawing, source follower areas SFA are formed inside the dummy region DMY. The source follower circuits SF3 shown in FIG. 8 are formed by using the source follower circuits SF1 which are formed in the pixels PX in the source follower areas SFA. Especially, the source follower circuits SF3 of this embodiment are formed by using the pixels PX which are shown in half-tone dot meshing and are positioned diagonally in the pixel array ARY.

Generally, in semiconductor devices, electric characteristics of elements are slightly different corresponding to the positions where the elements are formed. The source follower circuits SF3 are formed at the positions separated from each other in the pixel array ARY, so that the average characteristics of the source follower circuit SF3 can be obtained without fail.

According to the fourth embodiment described thus far, it is possible to obtain the same effects as those of the above-described first embodiment. Further, according to this embodiment, a pair of the source follower circuits SF3 are dispersively arranged inside the pixel array ARY, so that the characteristics of the source follower circuits SF3 can be averaged. Accordingly, the reference voltage generator 14C can generate the average reference voltage VREF independent of individual circuit characteristics of the source follower circuit SF3. Further, since the total amount of the current flowing in the source follower circuits SF3 can be increased, it is possible for the reference voltage generator 14C to generate the stable reference voltage VREF with high accuracy.

The source follower circuits SF3 are formed by using the source follower circuits SF1 of the pixels PX formed in the dummy region DMY in the pixel array ARY. Therefore, the electric characteristics of the source follower circuits SF3 are easily brought into agreement with those of the source follower circuits SF1. Further, the source follower circuits SF3 are respectively formed by using the pixels PX in the source follower areas SFA formed on both right and left sides of the pixel array ARY. Since the source follower circuits SF3 are formed at the positions separated from each other in the pixel array ARY, the average reference voltage VREF can be generated with ease.

Incidentally, the above-described first and second embodiment have dealt with the case where the gate widths of the transistors M5 and M6 of the source follower circuit SF2 are designed to be twice as large as the gate widths of the transistors M3 and M4 of the source follower circuit SF1. However, the present invention is not limited to such embodiments. For example, the transistors M5 and M6 may be designed to have the identical size with the transistors M3 and M4. In this case, the source follower circuit SF2 may be constituted by using the source follower circuit SF1 of the pixel PX formed in the dummy region in the pixel array ARY or the like. By forming the source follower circuit SF2 inside the pixel array ARY, it is possible to equalize the electric characteristics of the source follower circuits SF1 and SF2 without fail.

The above-described fourth embodiment has dealt with the case where a pair of the source follower circuits SF3 are formed using the pixels PX which are positioned diagonally in the pixel array ARY. However, the present invention is not limited to such an embodiment. The number of the source follower circuits SF3 may be larger than two. For example, the four source follower circuits SF3 may be formed by using the pixels PX positioned at four corners of the pixel array ARY.

The invention is not limited to the above embodiments and various modifications may be made without departing from the spirit and scope of the invention. Any improvement may be made in part or all of the components.

What is claimed is:

1. An imaging device comprising:
   a plurality of pixels each including a photoelectric conversion element, and a first source follower circuit generating a noise voltage and a pixel voltage according to an electric charge generated by the photoelectric conversion element;
   a reference voltage generator including a voltage generator generating a first reference voltage, and at least one second source follower circuit generating a second reference voltage according to the first reference voltage;
   a pixel signal generator outputting a voltage difference between the noise voltage and the pixel voltage as a pixel signal; and
   a noise voltage switching circuit outputting the noise voltage to said pixel signal generator when the noise voltage exceeds the second reference voltage, and outputting a first voltage as the noise voltage to said pixel signal generator when the noise voltage is equal to or lower than the second reference voltage.

2. The imaging device according to claim 1, wherein
   the second source follower circuit comprises a transistor having same characteristics as a transistor constituting the first source follower circuit.

3. The imaging device according to claim 2, wherein
   the transistor of the second source follower circuit has a same threshold voltage as a threshold voltage of the transistor of the first source follower circuit.

4. The imaging device according to claim 2, wherein
   the transistor of the second source follower circuit has a larger gate width and a same channel length as compared to the transistor of the first source follower circuit.

5. The imaging device according to claim 2, wherein
   the pixel comprises: a reset transistor connecting a constant voltage line to an input of the first source follower circuit; a transfer transistor connecting an output of the photoelectric conversion element to the input of the first source follower circuit; a source follower transistor constituting the first source follower circuit; and a selection transistor constituting the first source follower circuit and connecting an output of the source follower transistor to said noise voltage switching circuit, and
   the second source follower circuit comprises a source follower transistor receiving the first reference voltage, and a selection transistor connecting an output of the source follower transistor to an output node of the second reference voltage in said reference voltage generator.

6. The imaging device according to claim 5, further comprising
   an operation control circuit turning on the selection transistor of the second source follower circuit during a read period in which light received by the pixel is subjected to photoelectric conversion, and turning off the selection transistor during a standby period in which the light received by said pixel is not subjected to the photoelectric conversion.

7. The imaging device according to claim 1, wherein
   the voltage generator comprises a plurality of resistors connected in series, and generates the first reference voltage from any one of connecting nodes of the resistors.

8. The imaging device according to claim 1, wherein
   the voltage generator comprises a constant voltage generator generating the first reference voltage that is a constant voltage, using a power supply voltage.

9. The imaging device according to claim 8, wherein
   the voltage generator comprises a plurality of resistors connected in series, and generates the first reference voltage from the constant voltage generator and any one of connecting nodes of the resistors.

10. The imaging device according to claim 1, wherein
    said reference voltage generator comprises a plurality of second source follower circuits connected in parallel to receive the first reference voltage in common and generate the second reference voltage in common.

11. The imaging device according to claim 10, further comprising
    a pixel array in which said pixels are formed in a matrix state, and wherein
    the second source follower circuits are formed by using the first source follower circuits of a part of said pixels in the pixel array.

12. The imaging device according to claim 11, wherein
    the second source follower circuits are formed by using the first source follower circuit of the pixel at one end of the pixel array and the first source follower circuit of the pixel at the other end thereof.

13. The imaging device according to claim 1, further comprising
    a pixel array in which said pixels are formed in a matrix state, and wherein
    the second source follower circuits are formed by using the first source follower circuits of a part of said pixels in the pixel array.

14. The imaging device according to claim 1, further comprising
an operation control circuit sequentially executing: reset operation resetting an input of the first source follower circuit to a constant voltage; noise read operation generating the noise voltage by the first source follower circuit; charge transfer operation connecting the photoelectric conversion element to the source follower circuit; and pixel read operation generating the pixel voltage by the first source follower circuit, during a read period in which light received by the pixel is subjected to photoelectric conversion.

15. The imaging device according to claim 1, wherein
said pixel signal generator is a correlated double sampling circuit.

* * * * *